United States Patent
Falster

Patent Number: 5,882,989
Date of Patent: Mar. 16, 1999

[54] PROCESS FOR THE PREPARATION OF SILICON WAFERS HAVING A CONTROLLED DISTRIBUTION OF OXYGEN PRECIPITATE NUCLEATION CENTERS

[75] Inventor: Robert Falster, Milan, Italy

[73] Assignee: MEMC Electronic Materials, Inc., St. Peters, Mo.

[21] Appl. No.: 934,946

[22] Filed: Sep. 22, 1997

[51] Int. Cl.$^6$ .................................................. H01L 21/322
[52] U.S. Cl. .................. 438/473; 438/471; 148/DIG. 24; 148/DIG. 60
[58] Field of Search .................................. 438/400, 402, 438/471, 473; 117/2, 4, 20; 148/DIG. 24, DIG. 60; 257/610, 611, 617

[56] References Cited

U.S. PATENT DOCUMENTS

| | | | |
|---|---|---|---|
| 4,376,567 | 3/1983 | Nagasawa et al. | 148/1.5 |
| 4,417,943 | 11/1983 | Jacques et al. | 156/601 |
| 4,436,577 | 3/1984 | Frederick et al. | 156/617 |
| 4,437,922 | 3/1984 | Bischoff et al. | 156/603 |
| 4,511,428 | 4/1985 | Ghosh et al. | 156/601 |
| 4,548,654 | 10/1985 | Tobin | 148/1.5 |
| 4,851,358 | 7/1989 | Huber | 437/10 |
| 5,593,494 | 1/1997 | Falster | 117/2 |
| 5,674,756 | 10/1997 | Satoh et al. | |

OTHER PUBLICATIONS

Grovenor, Microelectronic Materials, Adam Hilger, pp. 74–75 (no month given), 1989.

*Primary Examiner*—Charles Bowers
*Assistant Examiner*—Keith Christianson
*Attorney, Agent, or Firm*—Senniger, Powers, Leavitt & Roedel

[57] ABSTRACT

A process for the preparation of silicon wafers having a non-uniform distribution of oxygen precipitate nucleation centers. Silicon wafers having a controlled distribution of oxygen precipitate nucleation centers are prepared by heating the wafer in a manner to create a temperature gradient across the thickness of the wafer for a period of time. Upon a subsequent oxygen precipitation heat treatment, those regions of the wafer which were rapidly heated to a temperature in excess of about 900° C. will form a denuded zone whereas those regions of the wafer which did not achieve a temperature in excess of about 900° C. during the rapid heating will form oxygen precipitates.

11 Claims, 2 Drawing Sheets

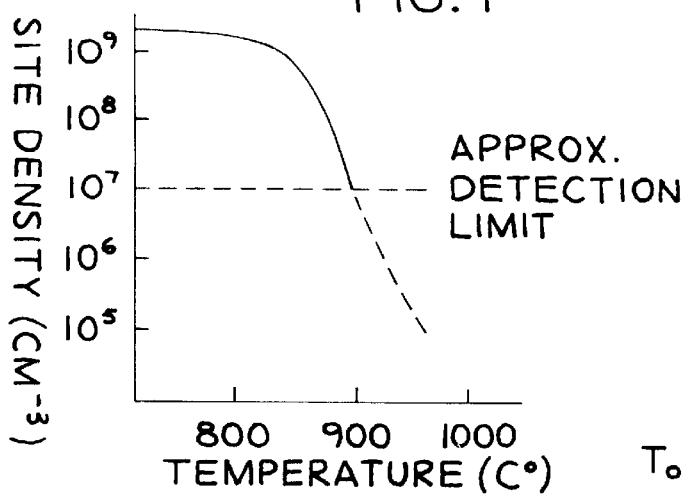
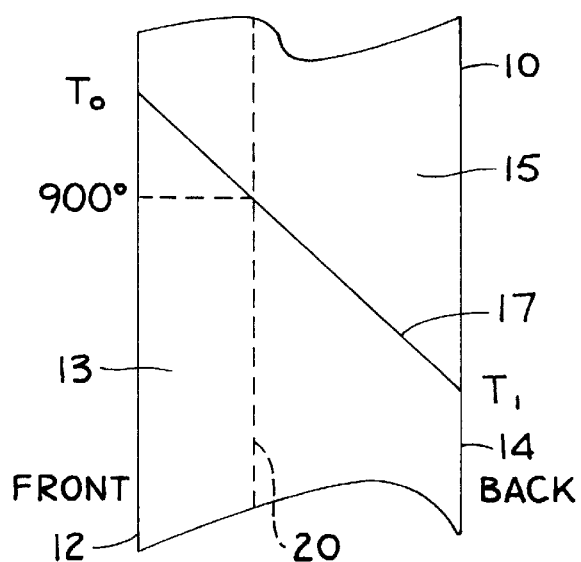
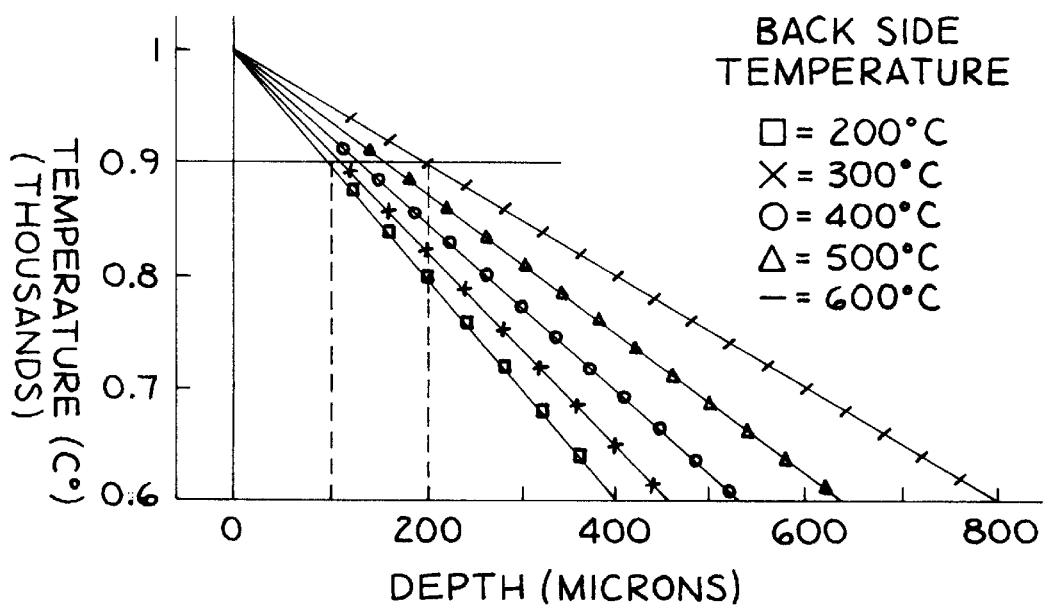

5,882,989

PROCESS FOR THE PREPARATION OF SILICON WAFERS HAVING A CONTROLLED DISTRIBUTION OF OXYGEN PRECIPITATE NUCLEATION CENTERS

BACKGROUND OF THE INVENTION

The present invention relates, in general, to a process for the preparation of silicon wafers having a controlled distribution of oxygen precipitate nucleation centers. More particularly, the present invention is for the preparation of wafers having a non-uniform distribution of oxygen precipitate nucleation centers wherein the distribution is such that, upon a subsequent oxygen precipitation heat treatment, the wafers form a denuded zone in the region near the surface of the wafer and oxygen precipitates in regions outside the denuded zone.

Single crystal silicon, the starting material for most processes for the fabrication of semiconductor electronic components, is commonly prepared with the so-called Czochralski process wherein a single seed crystal is immersed into molten silicon and then grown by slow extraction. At the temperature of the silicon molten mass, oxygen comes into the crystal lattice from the quartz crucible in which it is held until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of integrated circuits. As the crystal grows from the molten mass and cools, therefore, the solubility of oxygen in it decreases rapidly, whereby in the resulting slices or wafers, oxygen is present in supersaturated concentrations.

Thermal treatment cycles which are typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the bulk of the wafer are capable of trapping undesired metal impurities that may come into contact with the wafer. The use of oxygen precipitates located in the bulk of the wafer to trap metals is commonly referred to as internal or intrinsic gettering ("IG"). Oxygen precipitates located in the active device region of the wafer (within a few microns of the wafer's polished surface), however, can severely degrade device performance. Therefore, it is desirable to create a highly non-uniform distribution of these precipitates. The region near the front (polished) surface of the silicon wafer should contain a minimum density of these oxygen precipitates. The density of precipitates should then increase sharply at some distance (about 20–200 microns) from the surface. The precipitate free region near the surface is generally referred to as the "denuded zone." This zone is a critical parameter in the manufacture of integrated circuits ("IC").

Historically, depth distribution of oxygen precipitates has been controlled by insuring that a sufficient amount of oxygen out-diffuses to the wafer surface and is removed prior to the point at which significant precipitation begins to occur within the wafer. This out-diffusion process requires relatively long heat treatments at very high temperatures, e.g., about 16 hours at 1100° C. This out-diffusion step is then usually followed by a heat treatment (e.g., about 4 hours at 700° C.) to accelerate the subsequent precipitation of oxygen in those regions still containing sufficient amounts of oxygen.

A critical requirement for many electronic device fabricators is that all wafers subjected to this thermal sequence have a uniform and reproducible denuded zone and a uniform and reproducible number density of oxygen precipitates outside the denuded zone. Uniformity and reproducibility have been difficult to achieve at a reasonable cost, however. There are several parameters which affect the density of oxide precipitates which develop in a given silicon wafer in a given IC manufacturing process, including: (1) the concentration of interstitial oxygen, $[O_i]_i$ present initially in solid solution, (2) the density of pre-existing (to the IC manufacturing process) oxygen clusters which act as nucleation sites for the precipitation of supersaturated oxygen, (3) the stability of these pre-existing clusters at higher temperatures, and (4) the details of the thermal cycles employed to produce the electronic device. These parameters can vary significantly from one wafer to the next.

One approach which has been tried to control the range of the concentration of oxygen precipitates formed during an IC manufacturing process is to narrow the range of oxygen concentration for the wafers. For example, many IC fabricators require that the range of oxygen concentration be within 1 ppma of a target value, or even less. This approach, however, stretches technological capability, reduces the flexibility of crystal growers to control other parameters and increases costs. Even worse, tightening oxygen concentration specifications does not guarantee success; thermal histories of the silicon wafers can have a profound effect upon the oxygen precipitation behavior. Thus, wafers having the same oxygen concentrations but different thermal histories can exhibit significantly different precipitate densities.

In view of the fact that tightening oxygen concentration specifications by itself will not lead to a narrow range of oxygen precipitate densities, some have attempted sorting wafers by oxygen concentration or other criteria from which values of oxygen precipitation values can be predicted. See, for example, Miller U.S. Pat. No. 4,809,196. Wafer-to-wafer uniformity with respect to oxygen precipitation is improved by this approach, but flexibility is significantly impaired and costs are increased.

Bischoff et al. suggest a process for forming wafers having a wide denuded zone ($\geq 15$ $\mu$m) with a high precipitate density ($>10^{12}/cm^3$) in U.S. Pat. No. 4,437,922. In their process, the denuded zone is formed first by annealing the wafers at 1100° C. for four hours. After the denuded zone is formed, Bischoff et al. suggest that the wafers be annealed at temperature in the range of 400° to 500° C. to nucleate a high density of very small precipitates and grow them to such a size to permit survival of a subsequent heat treatment such as 925° C. Thereafter, Bischoff et al. suggest heating the wafers at a rate of less than 2° C. per minute to a temperature between 750° C. and 1000° C. and annealing the wafers at this temperature for a period which is sufficient to ensure the survival of the precipitates in subsequent processing. These steps add significant labor and cost to the wafers.

SUMMARY OF THE INVENTION

Among the objects of the present invention, therefore, are the provision of a process for the preparation of silicon wafers having a controlled distribution of oxygen precipitate nucleation centers; the provision of such a process in which the resulting wafers have a non-uniform distribution of oxygen precipitate nucleation centers such that, upon subsequent processing, the wafers form a denuded zone in the region near the surface of the wafer and oxygen precipitates in regions outside the denuded zone; the provision of such a process which does not depend upon the out-diffusion of oxygen; the provision of such a process that eliminates the need to renucleate sites for precipitation; and the provision of such a process in which the formation of the denuded zone and the formation of oxygen precipitates in the wafer bulk is not influenced by the thermal history and the oxygen concentration of the single crystal silicon ingot from which the silicon wafer is sliced.

The present invention is directed to a process for preparing a silicon wafer having a non-uniform distribution of oxygen precipitate nucleation centers such that upon additional heat treatment distinct regions of oxygen precipitates form in the silicon wafer. The process includes heating the front surface of the wafer to a temperature of about 950° C. while maintaining the back surface of the wafer at a temperature less than about 900° C. to create a temperature gradient across the thickness of the wafer.

Other objects and features of this invention will be in part apparent and in part pointed out hereinafter.

BRIEF DESCRIPTION OF THE DRAWINGS

FIG. 1 is a graph indicating the stability of oxygen precipitate nucleation centers at different temperatures.

FIG. 2 is a cross section of a silicon wafer showing a temperature gradient, and regions of differing oxygen precipitation behavior which are created as a consequence of this gradient.

FIG. 3 is a graph indicating possible denuded zone depths attainable as a function of the temperature at which the back side of the wafer is held for a front surface temperature of 1000° C.

DETAILED DESCRIPTION OF THE PREFERRED EMBODIMENTS

Figure 4:
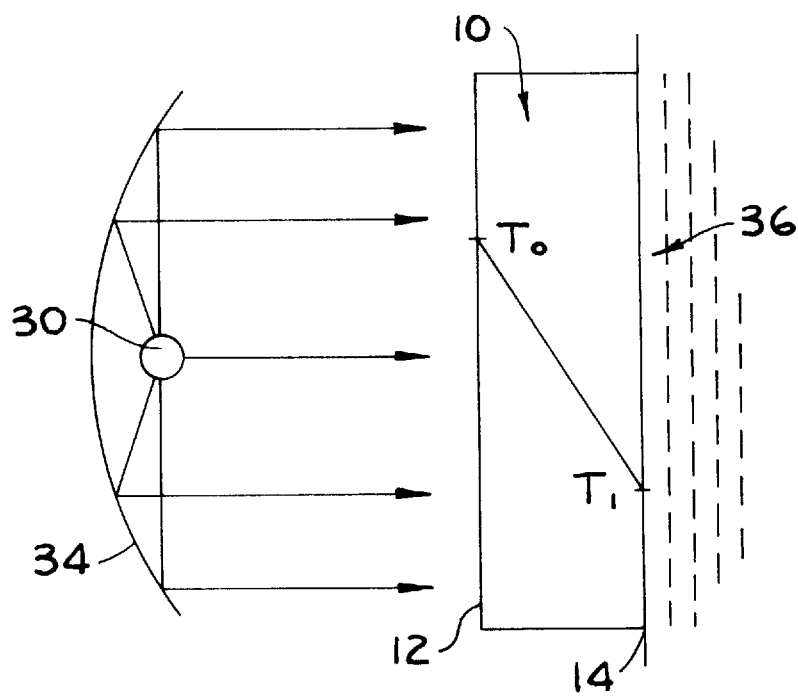
FIG. 4 is diagram illustrating how a temperature gradient can be created on a silicon wafer.

In accordance with the present invention, a process for the preparation of silicon wafers having a controlled distribution of oxygen precipitate nucleation centers has been discovered. In the process, two distinct regions of oxygen precipitation nucleation centers are formed by heating the front surface of a silicon wafer and contacting the back surface of the wafer to a heat sink to create a temperature gradient across the thickness of the wafer for a period of time on the order of seconds.

The starting material for the process of the present invention is single crystal silicon having a sufficient concentration of oxygen to enable its precipitation when subjected to an oxygen precipitation heat treatment. In general, Czochralski grown silicon typically has an oxygen concentration of about $6 \times 10^{17}$ to about $8.5 \times 10^{17}$ atoms/cm$^3$ (ASTM standard F-121-83), which is sufficient for the precipitation of oxygen.

Oxygen can be precipitated from silicon, for example, by subjecting the silicon to a heat treatment which comprises annealing the silicon at a temperature in the range of about 650° C. to about 875° C., preferably between about 800° C. and 875° C. to stabilize oxygen precipitate nucleation centers present in the silicon and annealing the silicon at a temperature of at least about 1000° C. to precipitate oxygen at the site of the stabilized nucleation centers. The amount of time required to stabilize the nucleation centers is dependant upon the heat-treating temperature and, in general, less time is required to stabilize the nucleation centers as temperature is increased. For example, at least about six hours at a temperature of about 650° C. is required to stabilize the nucleation centers in silicon having an oxygen concentration of about $7.8 \times 10^{17}$ atoms/cm$^3$, whereas only about one-half hour is required to stabilize the nucleation centers at a temperature of about 800° C. A preferred heat treatment for precipitating oxygen comprises heating the wafers to 800° C. for four hours and then to 1000° C. for sixteen hours.

In general, oxygen precipitate nucleation centers typically form in silicon which is annealed at a temperature in the range of about 350° C. to about 750° C. Thus, these centers may be formed during the cooling of crystal ingots following crystal growth or by heat treating the silicon in ingot or wafer form at temperatures within this range. Provided they have not been subjected to a stabilizing heat-treatment, these nucleation centers can be annealed out of silicon by rapidly heating the silicon to a temperature of at least about 875° C. and preferably continuing to increase the temperature to at least 1000° C. By the time the silicon reaches 1000° C., substantially all (e.g., >99%) of such defects have annealed out. It is important that the wafers be rapidly heated to these temperatures, i.e., that the rate of temperature increase be at least about 10° C. per minute and more preferably at least about 50° C. per minute. Otherwise, some or all of the oxygen precipitate nucleation centers may be stabilized by the heat-treatment. Equilibrium appears to be reached in relatively short periods of time, i.e., on the order of 1 minute. Accordingly, oxygen precipitate nucleation centers in the single crystal silicon starting material may be dissolved by annealing the silicon at a temperature of at least about 875° C. for a period of at least about 30 seconds, preferably at least about 10 minutes.

FIG. 1 shows a graphic illustration of this behavior. As the temperature of the silicon nears about 800° C. the site density of the oxygen precipitate nucleation centers begins to decrease as they anneal out of the silicon. As the temperature of the silicon reaches about 900° C., the oxygen precipitate nucleation centers are rapidly annealing out of the silicon and the approximate detection limit of about $10^7$ sites/cm$^3$ is reached. As the temperature continues to increase, the site density of the oxygen precipitate nucleation centers continues to decrease until greater than 99% of the sites have annealed out of the silicon at about 1000° C. The time required to achieve the equilibrium is very short, and is estimated to be about 1 second. Longer heat treatments at these temperatures, however, do not appreciably change the details illustrated in FIG. 1.

The present invention utilizes this behavior to create two distinct regions of oxygen precipitate nucleation centers in a silicon wafer. One region has no detectable oxygen precipitate nucleation centers (i.e., a denuded zone), and the other contains oxygen precipitate nucleation centers (i.e., the precipitate region).

These two regions are created by heating a silicon wafer in a manner which creates a temperature gradient across the thickness of the wafer for a period of time on the order of seconds. In general, the front (polished) surface of the wafer is heated to a temperature of at least about 950° C., preferably at least about 1000° C. Simultaneously, the back side of the wafer is in contact with a heat sink which maintains the back surface of the wafer at a temperature of less than about 900° C., preferably less than about 850° C. As a result, a thermal gradient develops between the front and back surfaces of the wafer with steady-state conditions being reached within a matter of a few seconds.

Referring now to FIG. 2, wafer 10, having a front surface 12 and a back surface 14, has been heat treated in accordance with the process of the present invention. Wafer 10 has two distinct regions with respect to oxygen precipitation nucleation centers. Region 13 contains no detectable oxygen precipitate nucleation centers whereas region 15 contains oxygen precipitate nucleation centers. These regions were created by heating the front surface to a temperature, $T_0$, which is greater than about 950° C., while maintaining the back surface at a temperature, $T_1$, which is less than about 900° C. to create a steady-state temperature gradient 17 across the thickness of the wafer. The position of the wafer at which the temperature gradient crosses the 900° C. threshold defines the boundary between regions 13 and 15. As a result, the silicon in regions 13 and 15 will exhibit markedly different behavior when the wafer is subjected to an oxygen precipitation heat treatment: a denuded zone will form in region 13 whereas oxygen precipitates will form in region 15. Significantly, the denuded zone boundary 20 occurs at the position in the silicon at which 900° C. is reached and is not controlled by the concentration of oxygen or the density of the pre-existing nucleation sites as is the case with the out-diffusion based methods. No special control of either oxygen concentration or crystal thermal history is thus required to obtain a controlled and reliable denuded zone. The oxygen specification of silicon wafers could be enlarged substantially over the present requirements which arise largely from the reliance on out diffusion based surface denuding methods. Also, crystal growth productivity could be enhanced by eliminating the need to control oxygen concentration.

Referring again to FIG. 2, region 15 (the precipitate region) is otherwise unaffected by the treatment and contains the density of sites pre-existing in the wafer prior to the treatment. Thus, if desired, the density of precipitate sites in this region could be adjusted by a variety of means accurately and independently of the desired depth of the denuded zone.

FIG. 3 illustrates possible denuded zone depths attainable as a function of the temperature at which the back side of the wafer is held for a front surface temperature of 1000° C. When the front side of the wafer is held at 1000° C. and the back side at 200° C., the denuded zone (i.e., the zone that reached at least 900° C.) will have a depth of approximately 100 microns. The denuded zone depth increases to about 200 microns when the back side is held at 600° C. for a front side temperature of 1000° C. In a preferred embodiment, the process would be performed on wafers at their thickest state, and before wafer polishing. Therefore, the final denuded zone depths would be smaller by an amount equal to the amount of material removed from the front surface by the polishing process.

Referring now to FIG. 4, a temperature gradient may be rapidly formed in a thin silicon wafer 10 using a pulse of light generated by lamp 30. Alternatively, a band of laps may be used. The light is reflected by mirror 34 to the front surface of the wafer 12 while maintaining the back surface of the wafer 14 at a temperature ($T_1$) by insuring good thermal contact to a solid heat sink 36. The illuminated surface will reach a temperature which depends upon: (1) the spectral power distribution of the illuminating lamp; (2) the thickness of the silicon wafer; (3) the temperature, $T_1$; and (4) the quality of the thermal contact of the silicon wafer to the heat sinking body.

Radiant powers on the order of about 1 to about 5 KW/cm² typically would be required to create a sufficient temperature gradient in a silicon wafer. To achieve a uniform temperature distribution across the surface of a 200 mm wafer, therefore, a peak lamp power of about 300 kW would generally be required. Such lamps are currently commercially available through, for example, Vortek Industries Limited in Canada.

Figure 5:
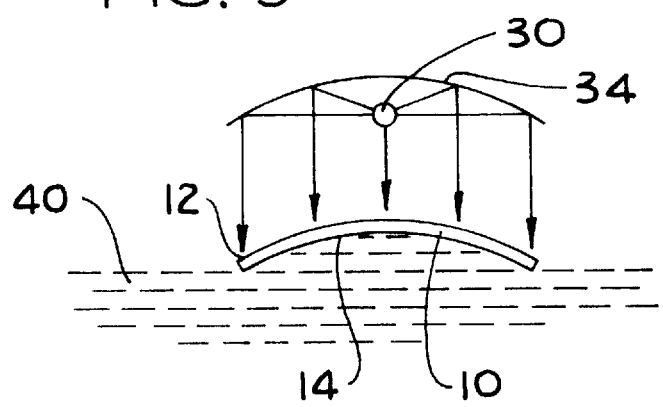
FIG. 5 is a diagram illustrating an alternative method for creating a temperature gradient on a silicon wafer.

Referring now to FIG. 5, the back side 14 of silicon wafer 10 is contacted with a liquid heat sink 40 in an alternative embodiment of the present invention. A liquid heat sink 40 has the advantage of being conformal thermal contact and allows the silicon wafer 10 to freely and elastically bow during rapid heating by lamp 30. This approach may lessen the shear stress on the wafer and reduce the likelihood of plastic deformation. Suitable liquid heat sinks are liquid sodium, lithium, lead, tin, or mercury.

In view of the above, it will be seen that the several objects of the invention are achieved.

As various changes could be made in the abovedescribed process without departing from the scope of the invention, it is intended that all matter contained in the above description be interpreted as illustrative and not in a limiting sense.

What is claimed is:

1. A process for the preparation of a silicon wafer having a non-uniform distribution of oxygen precipitate nucleation centers, the wafer having a front surface and a back surface, the process comprising heating the front surface of the silicon wafer to a temperature of at least about 950° C. while maintaining the back surface of the silicon wafer at a temperature less than 900° C. to create a temperature gradient across the thickness of the wafer.

2. The process of claim 1 wherein the temperature gradient in the silicon wafer is created by applying a pulse of light to the front surface of the wafer while maintaining the back surface of the wafer at a constant temperature by contacting the back surface with a heat sink.

3. The process of claim 2 wherein the back surface of the silicon wafer is mechanically fixed to a solid heat sink to maintain that wafer surface at a constant temperature.

4. The process of claim 2 wherein the back surface of the silicon wafer is contacting a liquid heat sink to maintain that wafer surface at a constant temperature.

5. The process of claim 4 wherein the liquid heat sink is selected from the group consisting of liquid sodium, lithium, lead, tin, and mercury.

6. The process of claim 2 wherein the pulse of light has a radiant power of between about 1 and about 5 kW/cm².

7. The process of claim 2 wherein the pulse of light has a radiant power of at about 1 kW/cm².

8. The process of claim 2 wherein the pulse of light is for a period of between about 1 and about 5 seconds.

9. The process of claim 2 wherein the pulse of light is for a period of about 1 second.

10. The process of claim 1 wherein the front surface of the wafer is heated to a temperature of about 1000° C.

11. The process of claim 1 wherein the back surface of the wafer is maintained at a temperature less than about 850° C.

* * * * *

UNITED STATES PATENT AND TRADEMARK OFFICE
CERTIFICATE OF CORRECTION

PATENT NO. : 5,882,989
DATED : March 16, 1999
INVENTOR(S) : Robert Falster

Page 1 of 1

It is certified that error appears in the above-identified patent and that said Letters Patent is hereby corrected as shown below:

<u>Column 6, claim 7,</u>
Line 53, "of at about 1 $kW/cm^2$" should read -- of at least about 1 $kW/cm^2$ --.

Signed and Sealed this

Sixteenth Day of April, 2002

Attest:

JAMES E. ROGAN
*Attesting Officer*    *Director of the United States Patent and Trademark Office*